United States Patent [19]
Deleonibus

[11] Patent Number: 5,973,365
[45] Date of Patent: Oct. 26, 1999

[54] MOS TRANSISTOR AND LATERAL INSULATING METHOD OF A MOS TRANSISTOR ACTIVE REGION

[75] Inventor: Simon Deleonibus, Claix, France

[73] Assignee: Commissariat a l'Energie Atomique, Paris, France

[21] Appl. No.: 09/011,751
[22] PCT Filed: Jun. 26, 1997
[86] PCT No.: PCT/FR97/01144
§ 371 Date: Feb. 23, 1998
§ 102(e) Date: Feb. 23, 1998
[87] PCT Pub. No.: WO97/50122
PCT Pub. Date: Dec. 31, 1997

[30] Foreign Application Priority Data

Jun. 27, 1996 [FR] France .................................. 96/08008

[51] Int. Cl.⁶ ...................... H01L 27/01; H01L 31/0392
[52] U.S. Cl. ............................................ 257/349; 257/347
[58] Field of Search ...................... 257/347, 349

[56] References Cited

U.S. PATENT DOCUMENTS

| | | | |
|---|---|---|---|
| 4,523,213 | 6/1985 | Konaka et al. | 257/347 |
| 4,635,344 | 1/1987 | Havemann | 438/455 |
| 5,470,781 | 11/1995 | Chidambarrao et al. | 437/68 |

FOREIGN PATENT DOCUMENTS 0 756 319 A2  1/1997  European Pat. Off. .

05259418  10/1993  Japan .

OTHER PUBLICATIONS

O. LeNeel et al., "Rounded Edge Mesa for Submicron SOI COMS Process", Proceedings of the European Solid State Device Research Conference (ESSDERC), pp. 13–14, Sep. 10, 1990.

S. Deleonibus et al., "A High Pressure High Temperature Poly Buffer LOCOS (HP–HTPBL) Isolation Process for 1Gbit Density Non Volatile Memories", International Conference on Solid State Devices and Materials, pp. 893–895, 1995.

S. Crowder et al., "Thermal Oxidation Kinetics and LOCOS Isolation in SOI Materials", Proceedings of the International SOI Conference, Ponte Verde Beach, Fl., Oct. 6–8, 1992, pp. 24–25.

*Primary Examiner*—David B. Hardy
*Assistant Examiner*—George C. Eckert, II
*Attorney, Agent, or Firm*—Oblon, Spivak, McClelland, Maier & Neustadt, P.C.

[57] ABSTRACT

A MOS type field effect transistor including a portion of silicon layer (114) forming an active region (114a) placed between a grid oxide layer (120) and a buried oxide layer (112), and laterally delimited by lateral oxide insulation blocks (116). The portion of the silicon layer (114) has concave edges (122, 124) facing the lateral oxide insulation blocks (116). The transistor is applicable to the manufacture of integrated circuits with low electricity consumption.

2 Claims, 2 Drawing Sheets

MOS TRANSISTOR AND LATERAL INSULATING METHOD OF A MOS TRANSISTOR ACTIVE REGION

DESCRIPTION

1. Technical Field

This invention relates to a MOS (Metal-Oxide-Semiconductor) type field effect transistor made on an SOI (Silicon On Insulator) type substrate, i.e. a substrate comprising a thin film of silicon on a silicon oxide support.

The invention also relates to a preparation process for an SOI type substrate to delimit active regions of MOS transistors on this substrate.

The invention is used for applications in microelectronics for the manufacture of components and fast integrated circuits with low electrical consumption.

2. State of Prior Art

In general, fast MOS transistors, and fast two-pole transistors, require high power supply voltages and cause problems due to their high consumption of electrical energy. With the increase in the integration density, the distance between the source and drain is tending to reduce. This phenomenon creates leakage currents between the source and the drain in MOS transistors and these currents reduce the reliability of components due to the Joule effect.

Components made on a silicon on insulator (SOI) type substrate are used to insulate the source and drain from the substrate and reduce parasite capacitances firstly between the source and the substrate, and secondly between the drain and the substrate. This characteristic enables components to operate at a high frequency. Excessive doping under the source and drain is also avoided. However, MOS transistors on SOI substrate have a high electrical consumption due to leakage currents under low inversion conditions, i.e. when the voltage applied to them is low and the transistor circuit is in a waiting or standby state. It also generates a large amount of noise between the source and the drain.

Problems of checking the characteristics of transistors in low inversion become more obvious with reference to FIG. 1.

FIG. 1 shows a section through a MOS transistor of a known type made on SOI substrate.

The transistor, seen in a cross-sectional view, is made on an SOI substrate 10 comprising a buried silicon oxide layer 12 and a surface silicon film 14. An active region 14a of the transistor is formed in film 14. It is delimited laterally by thick blocks of silicon oxide 16.

To simplify the Figure, and due to its symmetry, only one side, and only one block 16 is shown in FIG. 1.

A grid 18 formed essentially above the active region 14a is separated from this active region by a thin layer of grid oxide 20. The transistor source and drain do not lie in the plane of the section in FIG. 1 and consequently are not shown in it.

Problems in checking the characteristic in low inversion of a transistor conform with FIG. 1 are caused by three main phenomena.

The first phenomenon is the sharing of charges between the channel itself and the flank of the transistor. A second phenomenon is perforation between the transistor source and drain. Finally, a third phenomenon described below, is the leakage of currents through the "bottom" of the active region.

The first two phenomena are classical and also occur for MOS transistors made on a solid silicon substrate.

Control problems related to these two phenomena may be solved by varying the design and doping of transistor flanks and by an appropriate design of the source and drain regions. For example, it would be possible to implant sources and drains such that they have a gradual profile while reducing lateral diffusion under the grid (LDD). Document (1), the reference of which is given at the end of this description, provides further information about this subject.

The third phenomenon is specific to MOS transistors made on an SOI substrate. Note that the leakage current through the "bottom" of the active region includes a leak directly between the active region 14a and the buried layer of silicon oxide 12 and a leak on the edge of the active region at the interface between the active layer 14a, the silicon oxide block 16 and the buried layer 12.

This interface is referred to as the "lower corner" throughout the rest of this description, and it is identified by reference 24 in FIG. 1.

The leak generated directly at the interface between region 14a and layer 12 may be controlled by choosing a material quality and its production process. In this respect refer to document (2) referenced at the end of this description.

However, the leak generated in the lower corner 24 is more difficult to control. It is at least partly due to a defect in the doping impurities in this very small part of the active region.

The thicknesses of the corner 24 are between 0 nm and a few tens of nm.

For an active region in which the doping concentration is of the order of $10^{18}$ at.cm$^{-3}$, the average number of atoms actually present in an area with a 10 nm×10 nm section is less than 1.

Consequently, for lower doping concentrations in the active region, it is probable that no doping impurity atoms will be present in a given volume of the lower corner 24 of the silicon. Thus, the silicon in the lower corner 24, under the thick silicon oxide block 16, is practically intrinsic.

This phenomenon is further reinforced for transistors with enrichment with an n type channel doped with boron. The diffusion coefficient of boron in silicon oxide exceeds its diffusion coefficient in silicon. Thus, a confined region of silicon with a very small volume and surrounded by silicon oxide tends to become even further depleted in doping impurities. Consequently in this region, control of the space charge is difficult and a leakage current may occur through corner 24.

According to the information in document (1), the reference of which is given at the end of this description, it is also known that the upper corner of the active region 14a formed at the intersection of layer 14, the grid oxide layer 20 and the thick silicon oxide block 16 must preferably be rounded. This corner is indicated in FIG. 1 with reference 22.

The rounded edge of the upper corner 22 controls divergence of field lines in the semi-conducting part and thus avoids a badly controlled extension of the space charge area of the active polarized region.

One known way of obtaining a rounded upper corner on the active layer is to use a high temperature oxidization process to form thick oxide blocks 16.

High temperature oxidization is described in documents (3) and (4), the references of which are given at the end of this description.

High temperature processing to round the upper corner of the active region is known for making transistors on a solid silicon substrate and is based on the principle of creep in the silicon oxide. Consequently, this type of processing can only be considered to round the upper corner of the structure, i.e. which is freely exposed at its surface. Note also that initially, for SOI type substrates, this type of processing at high temperature could have negative effects by causing migration of doping impurities from the active region.

Furthermore, it is known that it is advantageous to have an overhang with a positive step between the surface 26 of the thick oxide block and the surface 28 of the grid oxide.

This positive step avoids the risk of parasite coupling between the transistor grid and the flank of the active area. This coupling would generate a leak.

In this respect, refer to documents (1) and (5), for which the references are given at the end of this description.

DISCLOSURE OF THE INVENTION

One purpose of this invention is to propose a process for the preparation of an SOI type substrate to delimit active regions of a transistor that is not affected by the limitations mentioned above.

More precisely, one purpose is to conform the active region so as to obtain total control of leakage currents under low inversion conditions, in other words when the transistor is below the conducting threshold.

In particular, one purpose is to significantly reduce leakage currents at the interface of the lower edges of the active region, in the thick insulation oxides laterally delimiting the active region and in the buried oxide layer.

Another purpose of the invention is to propose a transistor with low energy consumption, in other words with low leakage currents, when on standby.

In order to achieve these purposes, more precisely another objective of the invention is a MOS type field effect transistor comprising a portion of a silicon layer forming an active region, laid out between a grid oxide layer and a buried oxide layer, and delimited at the sides by lateral insulation oxide blocks. In accordance with the invention, the portion of the silicon layer has concave sides facing the lateral installation oxide blocks.

It is considered that the edges of the active region are concave when the upper end of the edges adjacent to the grid oxide layer, and the lower end of the edges adjacent to the buried oxide layer, are rounded.

In particular, the lower projecting corner of the active region extending between the buried oxide layer and the insulation oxide block, as described previously, is eliminated in the structure of the transistor according to the invention.

For reasons of convenience, the edge of the active layer adjacent to the grid oxide layer and the edge of the active layer adjacent to the buried oxide layer are referred to as the "upper corner" and "lower corner" respectively in the rest of the text.

The concave nature of the edges of the active layer makes it impossible to have small confined regions of intrinsic silicon. Consequently leakage currents are avoided.

Finally, note that for transistors with an n channel doped with boron, the problem of diffusion of the doping impurity (boron) towards the silicon oxide regions becomes marginal.

According to a particularly advantageous aspect, the insulation oxide blocks can form an overhang with a positive step with respect to the grid oxide layer.

The overhang with a positive step is considered between the surface of the insulation oxide blocks and the surface of the grid oxide layer.

Another purpose of the invention is a process for preparation of an SOI type substrate comprising a "subjacent" silicon layer, a "buried" silicon oxide layer, and a thin silicon surface film, to delimit at least one active region of the transistor in the silicon surface film with lateral insulation oxide blocks in which:

part of the surface film corresponding to each active region is covered with a layer of silicon nitride, and the silicon surface layer is oxidized locally in regions not covered by the silicon nitride layer to form insulation oxide blocks, according to the invention, local oxidation is done at high temperature.

As in the case of devices with classical MOS transistors on solid substrates, oxidization at high temperature makes it possible to round the upper corner of the edge of the active region, due to a phenomenon of creep in the silicon oxide in the lateral insulation blocks.

However, within the framework of the invention in its application for the preparation of SOI substrates, oxidation has another function which is to round the lower corner of the edge of the active region.

Note that it is impossible to round the lower corner by creep, due to the fact that the lower corner is not on the surface of the structure.

The function of thermal oxidation at high temperature within the framework of the invention is to increase the distribution of silicon interstitial atoms.

Interstitial atoms refer to silicon atoms that are no longer in their valence position in the silicon network, for example under the effect of thermal agitation.

The inventors have discovered that in the special case in which SOI substrates are prepared with a thin surface layer, the increase in the oxidation temperature enables SOI atoms to diffuse towards the lower corner of the edge of the active region. These atoms, which mainly originate from the subjacent silicon layer, may then be oxidized. The result is that the lower corner of the silicon is rounded.

In order to increase the diffusion of interstitial silicon atoms, their diffusion coefficient is increased by raising the oxidation temperature of insulating oxide blocks. However, according to one advantageous aspect of the invention, it is also possible to carry out the oxidation at high temperature and high pressure. The increase in the pressure can increase the density of available interstitial silicon atoms.

According to another aspect of the invention, local oxidation of the surface layer may comprise a first oxidation step using a dry method followed by a second oxidation step using a wet method, under steam.

The oxidation environment, and particularly a steam atmosphere, encourages the diffusion of interstitial silicon atoms from the subjacent silicon layer through the buried silicon oxide layer. The wet atmosphere also increases the diffusion coefficient of OH groups through the previously formed oxide and consequently accelerates the oxidation rate at the $Si/SiO_2$ interface of the lower edge of the active layer.

Preferably, oxidation by the wet method is preceded by a first oxidation step by the dry method.

Oxidation by the dry method is more selective with respect to the silicon nitride mask and limits the formation of a bird's beak by oxidation of the silicon nitride and oxidation of the silicon subjacent to the nitride layer.

According to another advantageous aspect of the invention, the active region may be doped after the high temperature oxidation. This type of doping, which is generally inefficient for conventional box structures, is possible due to the relatively thin nature of the surface silicon film.

Doping after the oxidation avoids the migration of doping impurities at high temperature.

Other characteristics and advantages of the invention will become obvious in the following description with reference to the Figures in the attached drawings, given for illustrative purpose only and in no way restrictive.

EMBODIMENTS OF THE INVENTION

Figure 2:
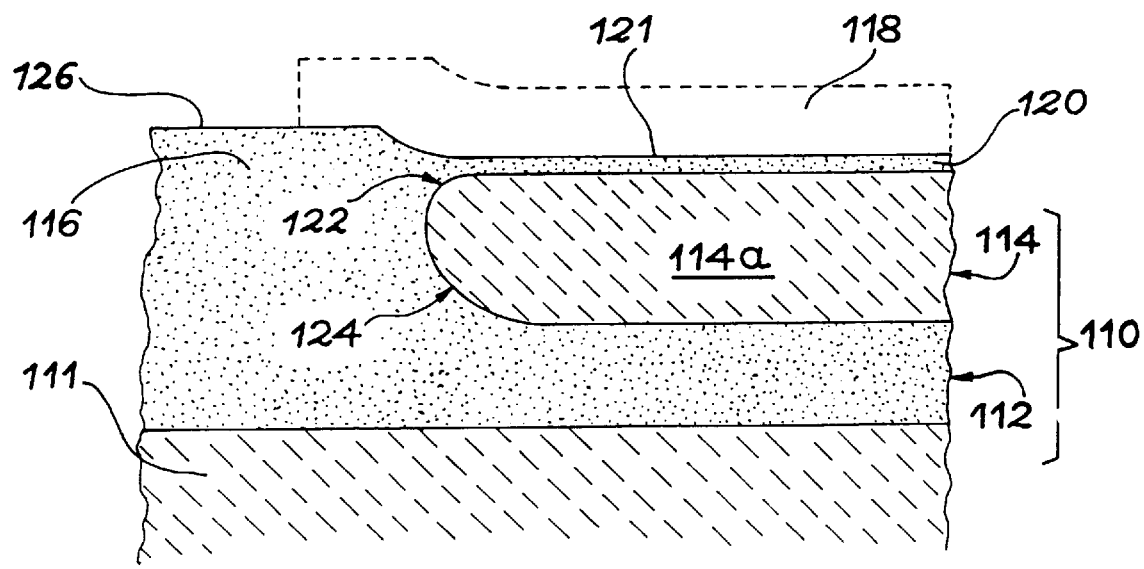
FIG. 2 is a partial schematic cross-section through a substrate and a transistor in accordance with the invention.

FIG. 2 shows a section through part of a substrate and a transistor conform with the invention.

Figure 1:
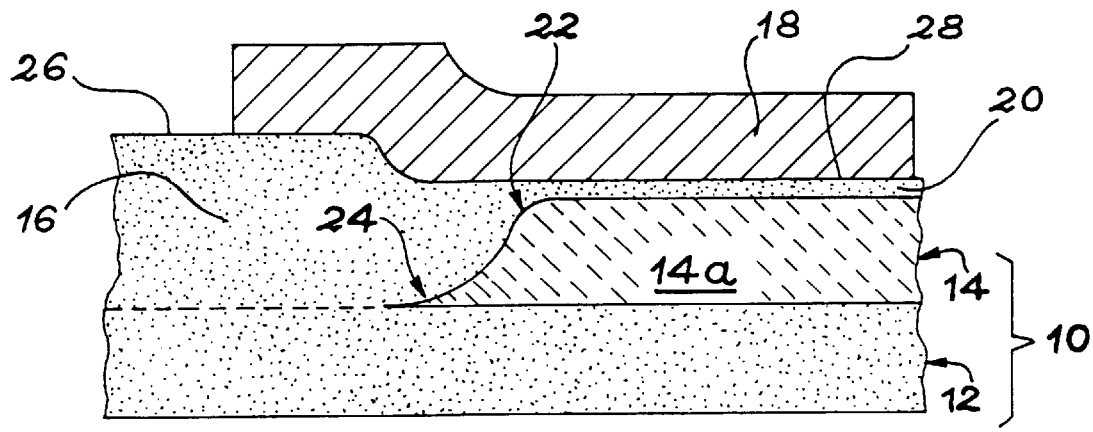
FIG. 1, described above, is a partial schematic cross-section of a known transistor with lateral insulation by silicon oxide blocks on an SOI substrate.

Due to the similarity of a number of elements with FIG. 1, identical or similar elements in FIG. 2 have the same reference plus 100.

The transistor in FIG. 2 is made on an SOI substrate 110 comprising a subjacent silicon support layer 111, a buried silicon oxide layer 112 and a thin silicon surface film 114. One or several active regions 114a in the surface film 114 are delimited by silicon oxide blocks 116 forming side insulation. Blocks 116 are formed by local oxidation. Note that only part of the active region 114a and part of an oxide block 116 are shown in FIG. 2.

References 122 and 124 identify the upper and lower corners respectively of the edge of the active region facing the oxide block 116.

A silicon oxide layer forming a grid oxide 120 separates the active region 114a of the grid 118, represented for guidance only by a dashed line.

Due to the plane of the transverse section in the active region, the transistor drain and source do not lie in the plane of the Figure. Similarly, the connection points onto transistor terminals are not shown for simplification reasons.

According to the invention, the active region 114a of the transistor is a portion of the silicon layer 114 with concave edges facing the block 116. The concave nature of the edge is due to the rounded upper 122 and lower 124 corners.

The field oxide block 116 extends into the thin surface layer over its entire thickness, and becomes coincident with the buried silicon oxide layer 112.

FIG. 2 also shows an overhang with a positive step between the free surface 126 of the oxide block 116 and the surface 121 of the grid oxide layer 120 in contact with the grid 118.

Figure 3:
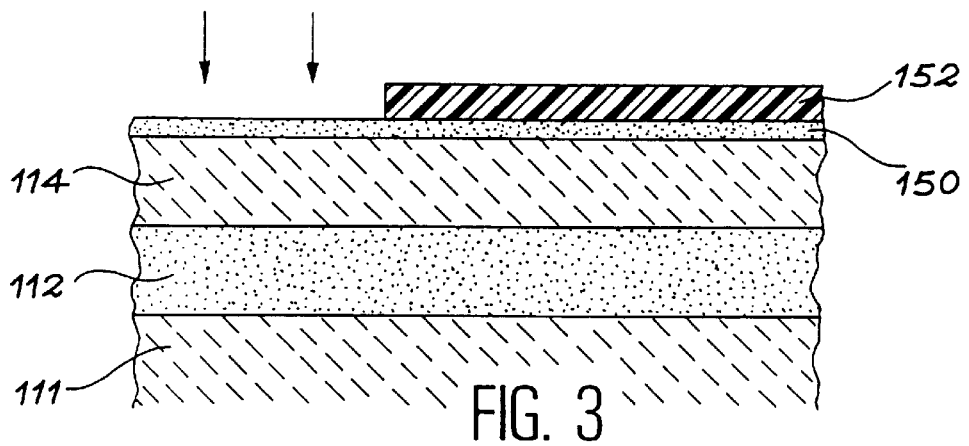
FIGS. 3, 4 and 5 are partial schematic cross-sections through an SOI substrate and illustrate steps in the preparation of this substrate in accordance with an embodiment of the process according to the invention.
Figure 4:
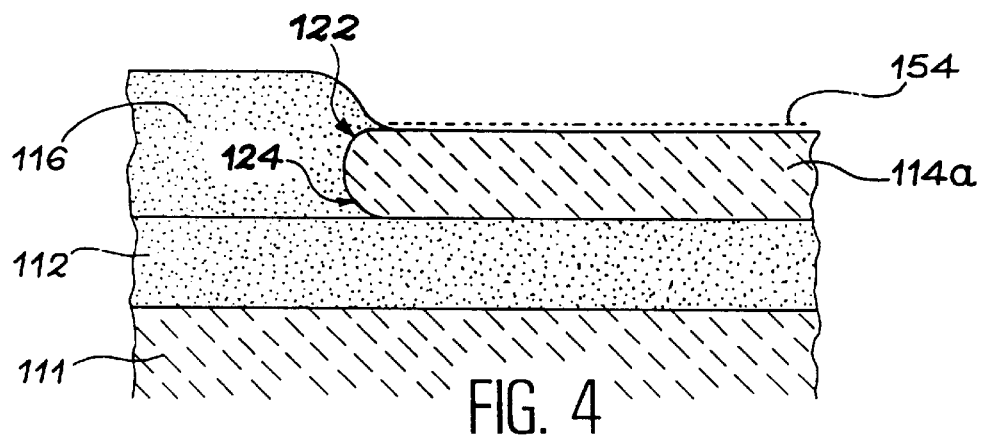
Figure 5:
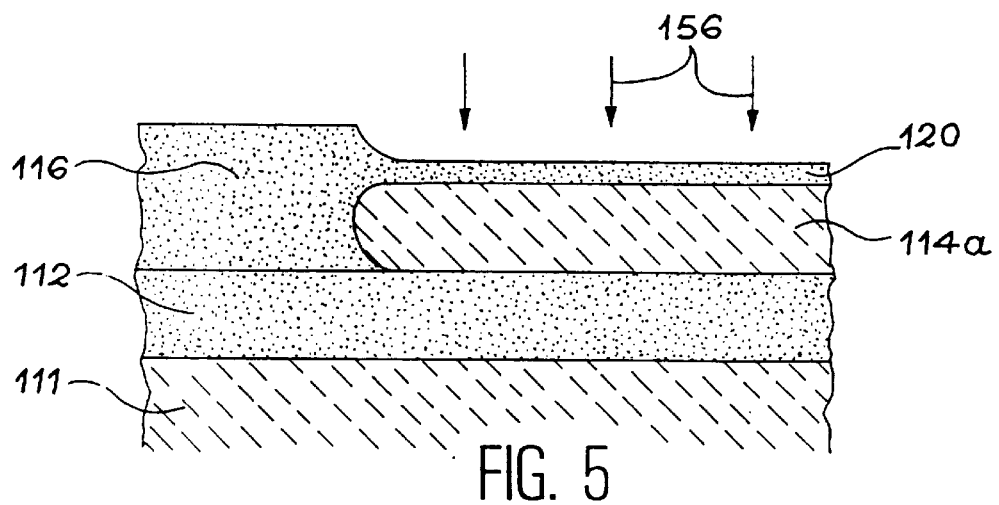

Refer to FIGS. 3, 4 and 5 for a description of the embodiment of the substrate preparation process. Elements identical or similar to elements in FIG. 2 have the same references.

As can be seen in FIG. 3, the starting point is an SOI type substrate with a "subjacent" silicon layer 111, a buried silicon oxide layer 112 and a surface film 114.

The first step consists of forming a thin layer 150 of silicon oxide by oxidation, on the surface of film 114. The layer 150, called the pedestal layer, limits the stress induced during local oxidation on the active area.

A layer of silicon nitride is formed on layer 150. This silicon nitride layer is formed with photolithography processes known in themselves, to define one or several patterns 152 that cover parts of the SOI substrate corresponding to the future active regions. Throughout the rest of the description, we will only refer to a single pattern 152. However, several patterns of this type could define several active regions simultaneously. After eliminating a resin mask (if any) used to form the pattern 152, the substrate is oxidized locally to define thick silicon oxide blocks in it.

In the example described, oxidation is done in regions not protected by silicon nitride in two distinct steps.

A first step consists of oxidation in a dry environment under an $0_2$ atmosphere with HCl. This dry oxidation limits oxidation of the silicon nitride pattern 152 and consequently limits the extension of the bird's beak, in other words the deformation of the substrate surface appearing at the edge of the nitride a pattern 152. The silicon nitride oxidizes much less quickly in a dry atmosphere than in a wet atmosphere.

A second oxidation step is carried out in a moist atmosphere with an $O_2$ and $H_2$ mixture. This second step rounds the edges 122, 124 of the active region 114a more easily, and particularly the lower corner 124. This is shown in FIG. 4.

Oxidations are carried out at a temperature preferably between 1000° C. and 1200° C. and at a pressure preferably between $10^5$ and $10^7$ Pa.

After the oxidation, the layer of partially oxidized nitride forming the pattern 152, and the pedestal layer in the active region 114a which is now defined and delimited by thick oxide blocks, are eliminated. Only one of these blocks 116 can be seen in FIG. 4.

Accessorily, the surface of the active area 114a may be cleaned by forming a thin layer 154 of sacrificial oxide by oxidation, and then by eliminating this layer. The layer 154 of sacrificial oxide is shown in FIG. 4 as a dashed line.

The substrate is then ready to make one or several transistors on it in the active regions.

As shown in FIG. 5, the substrate preparation may be completed by doping 156 by the implantation of boron atoms (N channel) in the active areas 114a and the formation of a grid oxide layer 120 on the active region. Doping of the active region at this stage of the process can eliminate doping impurities from the effects of the high oxidation temperature.

A grid, source and drain areas not shown in FIG. 5, are then made using techniques known in themselves, in order to make a transistor.

A transistor such as that shown in FIG. 2 described above is then obtained.

This type of transistor has the advantage that it is fast and has a low consumption when on standby due to the limited leakage currents at the edge of the active region.

REFERENCES (1)
A Post Gigabit Generation Flash Memory Shallow Trench Isolation Scheme. The LATI-STI Process (Large Tilt Implanted Sloped Trench Isolation) Using 100% CMP Planarization. By S. DELEONIBUS et al., Extended Abstracts of the 1995 International Conference on Solid State Devices and Materials, Osaka, 1995, pp. 587–589

(2)
Microstructures of silicon implanted with high dose oxygen ions by C. Jaussaud et al., Appl. Phys. Lett., 46 (11), June 1, 1985, p. 1064–1066

(3)

A High Pressure High Temperature Poly Buffer LOCOS (HP-HTPBL) Isolation Process for 1Gbit Density Non Volatile Memories by S. DELEONIBUS et al., Extended Abstracts of the 1995 International Conference on Solid State Devices and Materials, Osaka, 1995, pp. 893–895

(4)

High Pressure Oxidation of Silicon in Dry Oxygen by Liang N. Lie et al., J. Electrochem Soc: Solid-state Science and Technology December 1982, pages 2828–2834

(5)

"Trench Isolation for 0.45 μm Active Pitch and Below" by Asanga H. Perera, et al., DITTO 95, pages 679–682

I claim:

1. A MOS type field effect transistor comprising:

a grid oxide layer;

a buried oxide layer;

lateral insulation oxide blocks;

a portion of a silicon layer forming an active region located between said grid oxide layer and said buried oxide layer, and delimited laterally by said lateral insulation oxide blocks;

wherein the portion of the silicon layer has concave edges facing the lateral insulation oxide blocks; and said concave edges of said portion of the silicon layer comprise top and bottom concave edges formed on sides of said portion of the silicon layer facing said grid oxide layer and said buried oxide layer, respectively.

2. The transistor according to claim 1, wherein said insulation oxide blocks form an overhang with a positive step above said grid oxide layer.

* * * * *